(12) United States Patent
Hsu et al.

(10) Patent No.: US 9,947,830 B2
(45) Date of Patent: Apr. 17, 2018

(54) PATTERNED SAPPHIRE SUBSTRATE AND LIGHT EMITTING DIODE

(71) Applicant: XIAMEN SANAN OPTOELECTRONICS TECHNOLOGY CO., LTD., Xiamen (CN)

(72) Inventors: Sheng-hsien Hsu, Xiamen (CN); Gong Chen, Xiamen (CN); Su-hui Lin, Xiamen (CN); Yu-chieh Huang, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/422,216

(22) Filed: Feb. 1, 2017

(65) Prior Publication Data

US 2017/0141266 A1    May 18, 2017

Related U.S. Application Data

(63) Continuation of application No. PCT/CN2015/097562, filed on Dec. 16, 2015.

(30) Foreign Application Priority Data

Dec. 29, 2014 (CN) .......................... 2014 1 0830886
Dec. 29, 2014 (CN) .......................... 2014 1 0832667

(51) Int. Cl.
*H01L 33/00* (2010.01)
*H01L 33/22* (2010.01)
(Continued)

(52) U.S. Cl.
CPC ............ *H01L 33/22* (2013.01); *H01L 33/007* (2013.01); *H01L 33/06* (2013.01); *H01L 33/16* (2013.01);
(Continued)

(58) Field of Classification Search
CPC ....... H01L 33/22; H01L 33/16; H01L 33/007; H01L 33/32; H01L 33/06; H01L 2933/0058
(Continued)

(56) References Cited

U.S. PATENT DOCUMENTS 7,790,584 B2 * 9/2010 Paek ................... H01L 21/0242
                                                                                117/101
8,686,457 B2 * 4/2014 Minato ................... H01L 33/10
                                                                                257/623
(Continued)

FOREIGN PATENT DOCUMENTS

CN        103545411 A      1/2014

*Primary Examiner* — Vu A Vu
(74) *Attorney, Agent, or Firm* — Syncoda LLC; Feng Ma; Junjie Feng

(57) ABSTRACT

A patterned sapphire substrate has a first surface and a second surface opposite to each other; the connection zone between first protrusion portions has no C surface (i.e. (0001) surface); and the patterned sapphire substrate may have no C surface on the growth surface to reduce the threading dislocation density of the GaN epitaxial material on the sapphire substrate.

17 Claims, 10 Drawing Sheets

(51) Int. Cl.
*H01L 33/32* (2010.01)
*H01L 33/06* (2010.01)
*H01L 33/16* (2010.01)

(52) U.S. Cl.
CPC ...... *H01L 33/32* (2013.01); *H01L 2933/0058* (2013.01)

(58) Field of Classification Search
USPC .......................................................... 257/98
See application file for complete search history.

(56) References Cited

U.S. PATENT DOCUMENTS

| | | |
|---|---|---|
| 2012/0074431 A1 | 3/2012 | Narita et al. |
| 2013/0193448 A1 | 8/2013 | Chou et al. |
| 2014/0124816 A1* | 5/2014 | Choe .................. C30B 25/04 257/98 |
| 2014/0319657 A1 | 10/2014 | Li |

* cited by examiner

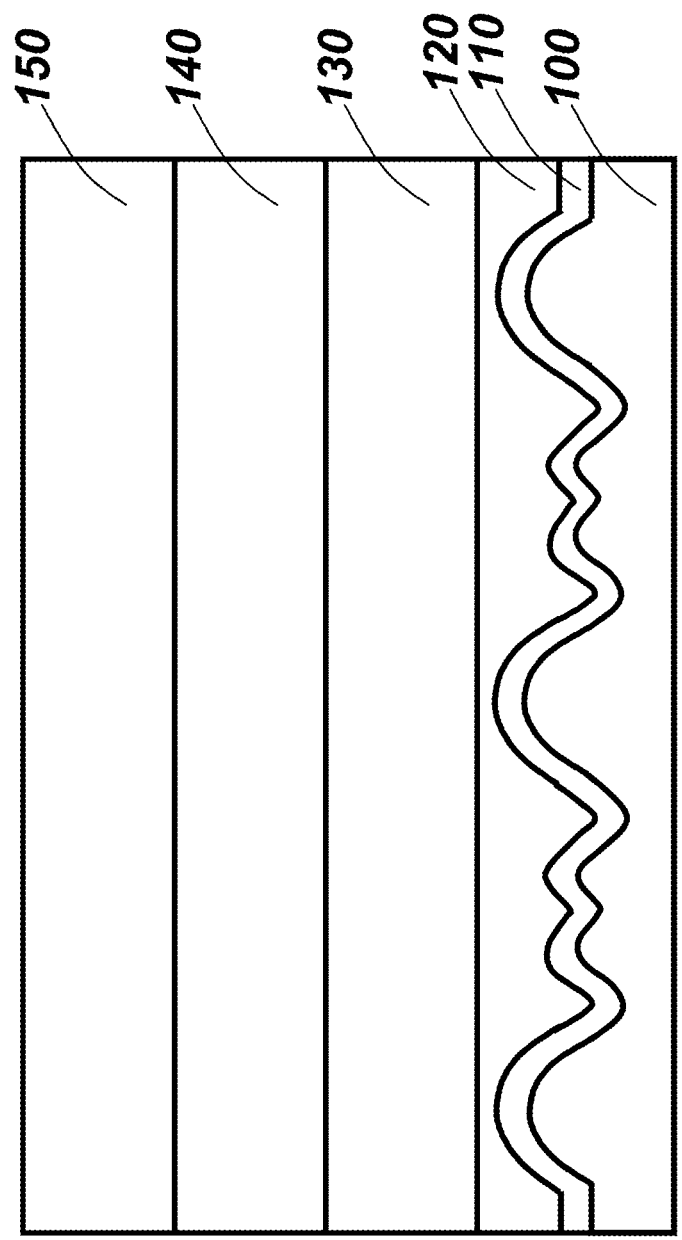

PATTERNED SAPPHIRE SUBSTRATE AND LIGHT EMITTING DIODE

CROSS-REFERENCE TO RELATED APPLICATIONS

The present application is a continuation of, and claims priority to, PCT/CN2015/097562 filed on Dec. 16, 2015, which claims priority to Chinese Patent Application No. 201410830886.2 filed on Dec. 29, 2014, and Chinese Patent Application No. 201410832667.8 filed on Dec. 29, 2014. The disclosures of these applications are hereby incorporated by reference in their entirety.

BACKGROUND

A patterned sapphire substrate (PSS) is a sapphire substrate with a patterned surface formed via photoetching and etching. The patterned substrate, on the one hand, can effectively reduce dislocation density of the epitaxial structure and improve lattice quality and evenness of the epitaxial material, thereby enhancing the internal quantum light-emitting efficiency; on the other hand, the array pattern structure increases light scattering and changes light route of the light emitting diode, thus optimizing chance for light-emitting.

Existing patterned substrates generally have a large-size C surface (i.e., (0001) surface of the sapphire). The threading dislocation of the C surface is prone to extend to the quantum well of light emitting diode, causing non-radiative recombination. The Chinese Patent No. CN102244170B discloses a patterned sapphire substrate with photonic quasi-crystal, with the attempt to cut the area proportion of the exposed C surface of the patterned structure on the entire sapphire substrate. However, as the patterned structure is composed of a series of photonic crystals, the gap 205 is bound to exist between photonic crystals, i.e., a C surface exists.

SUMMARY

Some embodiments disclosed herein provide a patterned sapphire substrate and a method for manufacturing the same, and a light emitting diode comprising such a patterned sapphire substrate, wherein the patterned sapphire substrate may have no C surface on the growth surface to reduce the threading dislocation density of the GaN epitaxial material on the sapphire substrate.

According to a first aspect of the present disclosure, a patterned sapphire substrate composed of a first surface and a second surface opposite to each other is provided, in which, the first surface comprises a series of regularly-arranged first protrusion portions in first size d1, wherein, the connection zone between first protrusion portions has no C surface (i.e. (0001) surface).

In some embodiments, three adjacent first protrusion portions form a triangle, each having a second protrusion portion in second size d2 inside, where d1>d2, and the first protrusion portion and the second protrusion portion are connected directly or via a curved surface so that the connection zone has no C surface.

Preferably, the first protrusion portion has no C surface.
Preferably, the second protrusion portion has no C surface.
Preferably, the first surface completely has no C surface.
Preferably, four adjacent first protrusion portions form a rhombus, in which, between the long diagonals are two second protrusion portions and between the short diagonals is a third protrusion portion in third size d3, where d3<d2.

Preferably, a recess portion is between two second protrusion portions, the lowest portion of which is the highest point of the third protrusion portion.

Preferably, the second protrusion portion is a cone mainly composed of three or more inclined surfaces, each corresponding to one of the three first protrusion portions respectively. Preferably, angle between the inclined surface of the second protrusion portion and the C surface of the sapphire substrate is 10°-40°. In some embodiments, between two nearest first protrusion portions, there is a V-shape notch positioned between two adjacent second protrusion portions at the same time, in which, two sides of the V-shape notch are composed of the inclined surfaces of two second protrusion portions.

Preferably, the ratio of height h1 of the first protrusion portion and height h2 of the second protrusion portion is 2-50.

Preferably, the first protrusion portion covers 50%-90% of total area of the first surface.

Preferably, the top part of the first protrusion portion is a cone and its projection on the C surface appears round or polygon.

According to a second aspect of the present disclosure, a method for manufacturing a patterned sapphire substrate is provided, comprising: 1) providing a sapphire substrate composed of a first surface and a second surface opposite to each other, and forming a patterned mask layer on the first surface; 2) forming a series of protrusion structures on the first surface via dry etching, wherein, the connection zone between protrusion structures is etched to a small convex surface; 3) wet etching the first surface of the sapphire substrate to form a patterned surface composed of a series regularly-arranged first protrusion portions in first size d1, wherein, the connection zone between first protrusion portions has no C surface (i.e. (0001) surface).

Preferably, the patterned mask layer in step 1) is composed of a series of column light resistances, oxides or metals.

Preferably, diameter of the pattern in step 1) is 0.5 μm-6 μm, and inter-pattern gap is 0.5 μm-6 μm.

Preferably, the small convex surface connecting protrusion structures formed in step 2) is a curved surface.

Preferably, the small convex surface connecting protrusion structures formed in step 2) is 0.05 μm-0.5 μm high.

Preferably, in step 3), the patterned surface is formed by etching the first surface of the sapphire substrate with sulfur phosphoric acid mixture.

According to a third aspect of the present disclosure, a light emitting diode is provided, comprising any of the aforementioned patterned sapphire substrate and a light-emitting epitaxial laminated layer on the patterned sapphire substrate.

Preferably, on the surface of the patterned sapphire substrate is an AlN layer formed via PVD, and the light-emitting epitaxial laminated layer is formed on the AlN layer.

Preferably, the AlN layer is 10 Å-200 Å thick.

According to a fourth aspect of the present disclosure, a method for manufacturing a light emitting diode is provided, comprising: 1) providing a sapphire substrate composed of a first surface and a second surface opposite to each other, and forming a patterned mask layer on the first surface; 2) forming a series of protrusion structures on the first surface via dry etching, wherein, the connection zone between protrusion structures is etched to a small convex surface; 3) wet etching the first surface of the sapphire substrate to form a patterned surface composed of a series regularly-arranged first protrusion portions in first size d1, wherein, the first protrusion portions are connected via a curved surface so that the connection zone has no C surface (i.e. (0001) surface); 4) forming an AlN layer on the patterned surface via PVD; and 5) forming a light-emitting epitaxial laminated layer on the AlN layer through epitaxial growth, which comprises at least an n-type semiconductor layer, a light-emitting layer and a p-type semiconductor layer.

Preferably, the small convex surface connecting protrusion structures formed in step 2) is a curved surface.

Preferably, in step 3), the patterned surface is formed by etching the first surface of the sapphire substrate with sulfur phosphoric acid mixture.

In some embodiments, the patterned surface formed in step 3 has a series of second protrusion portions in second size d2; three adjacent first protrusion portions form a triangle, each having a second protrusion portion inside, where d1>d2; and the first protrusion portion and the second protrusion portion are connected directly or via a curved surface so that the connection zone has no C surface (i.e. (0001) surface).

In some embodiments, the AlN layer formed in step 4) is 10 Å-200 Å thick.

In the patterned sapphire substrate according to some embodiments, the surface pattern structure completely has no C surface. On the one hand, it can effectively eliminate the threading dislocation formed on the C surface to improve lattice quality of the epitaxial structure; on the other hand, with no c surface, more light will be emitted from the light emitting diode to greatly improve light extraction efficiency of LED.

In another aspect, a light-emitting system is provided including a plurality of the light-emitting diodes. The light-emitting system can be used, for example, in lighting, displays, signage, etc.

Other features and advantages of this present disclosure will be described in detail in the following specification, and it is believed that such features and advantages will become more obvious in the specification or through implementations of the present disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the invention and constitute a part of this specification, together with the embodiments, are therefore to be considered in all respects as illustrative and not restrictive. In addition, the drawings are merely illustrative, which are not drawn to scale.

FIG. 10 is a structural diagram of a light emitting diode according to some embodiments.

Figure 1:
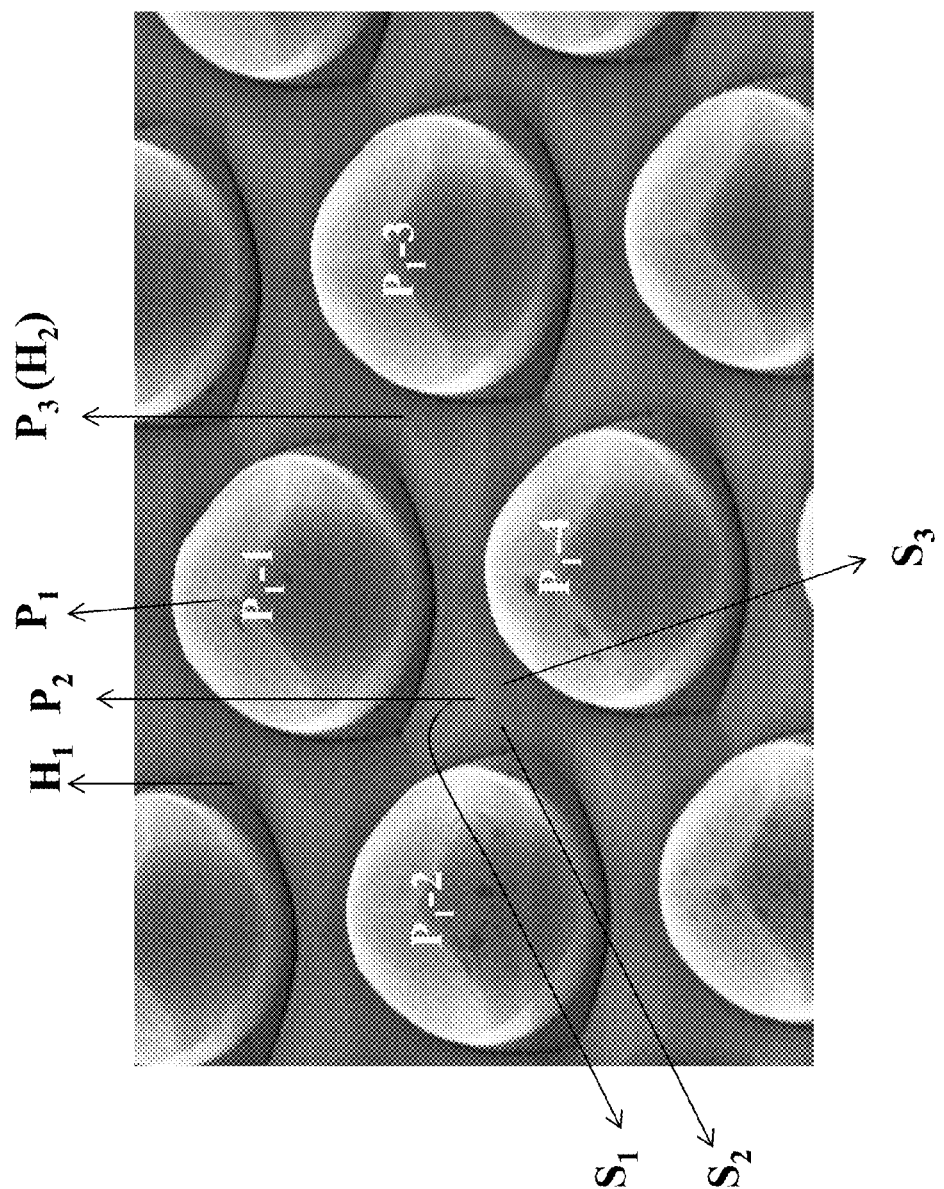
FIG. 1 is an SEM diagram of a patterned sapphire substrate according to some embodiments.

In the drawings:
100: sapphire substrate; 110: AlN layer; 120: buffer layer; 130: n-type semiconductor layer; 140: light-emitting layer; 150: p-type semiconductor layer; 200: patterned mask layer; 210: protrusion structure; 220: small convex surface; $P_1$: first protrusion portion; $P_2$: second protrusion portion; $P_3$: third protrusion portion; $H_1$: first recess portion; $H_2$: second recess portion; $S_1$, $S_2$, $S_3$: inclined surfaces of second protrusion portion.

DETAILED DESCRIPTION

Various embodiments will be described in detail below with reference to accompany drawings.

Figure 2:
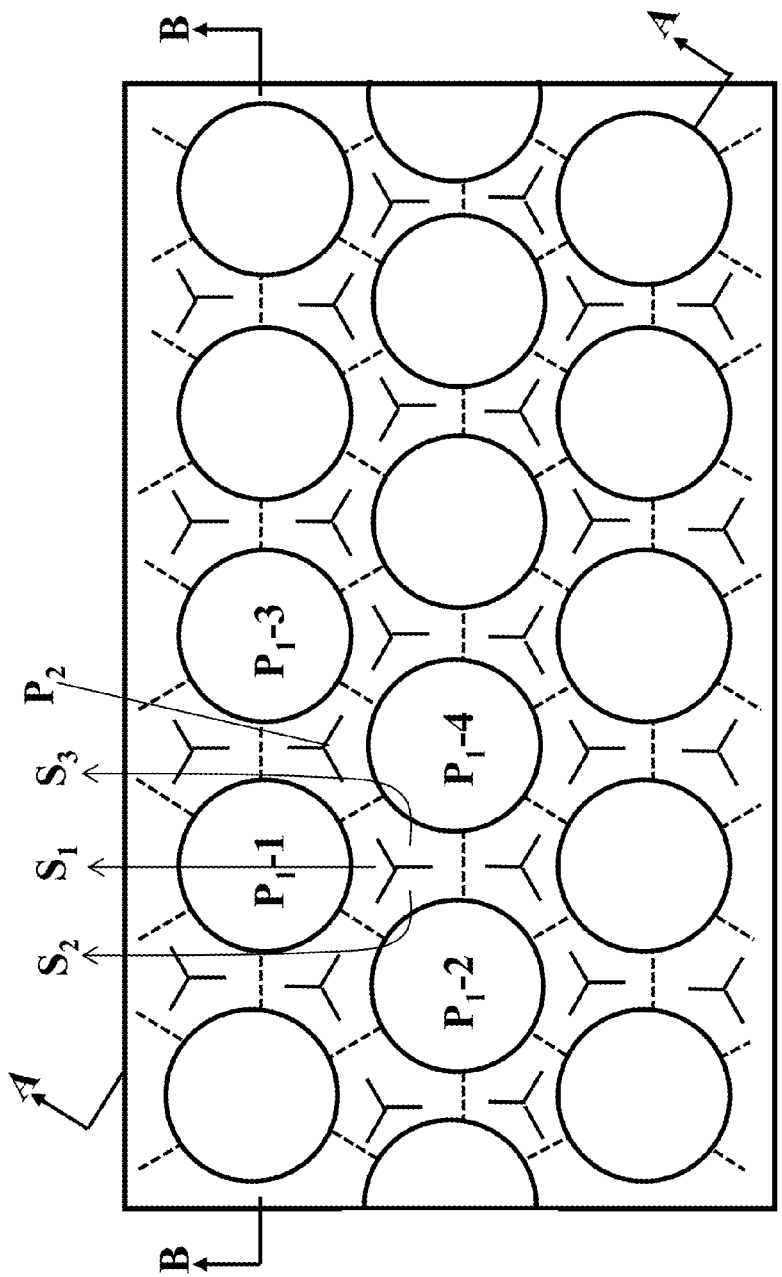
FIG. 2 is a top view of a patterned sapphire substrate according to some embodiments.
Figure 3:
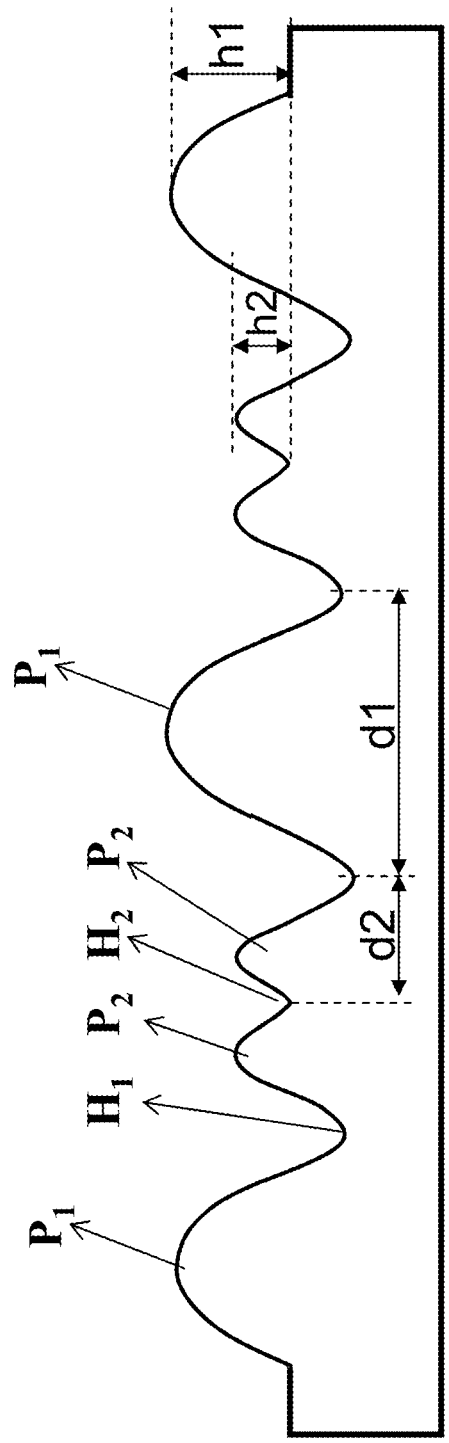
FIG. 3 is a sectional view along line A-A in FIG. 2.
Figure 4:
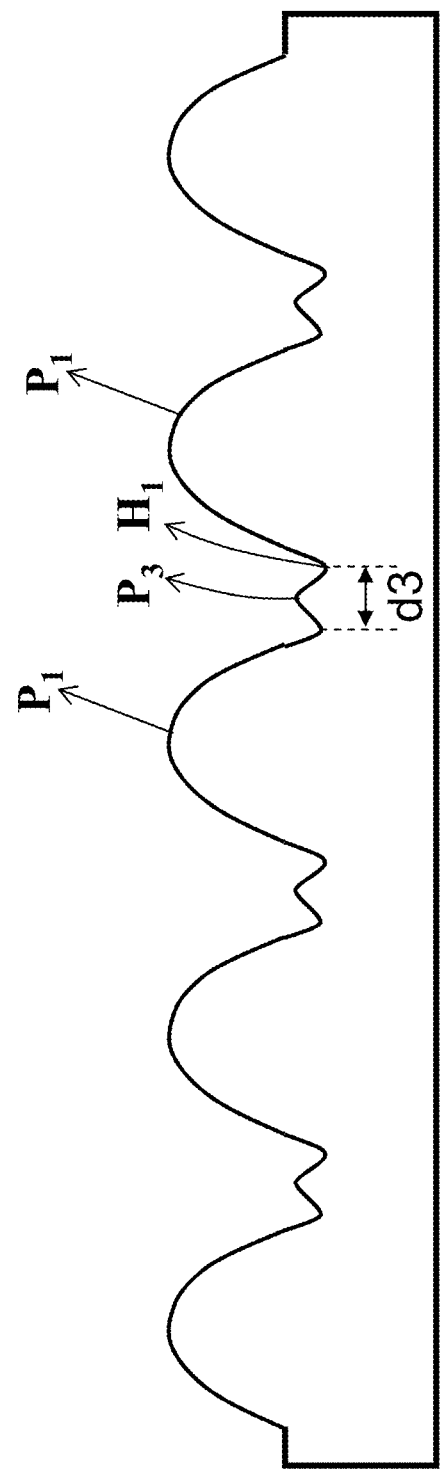
FIG. 4 is a sectional view along line B-B in FIG. 2.

FIGS. 1-4 illustrates a preferred embodiment, wherein FIG. 3 is a section view along line A-A in FIG. 2, and FIG. 4 is a section view along line B-B of FIG. 2.

Referring to FIGS. 1-2, a patterned sapphire substrate is provided, in which, the upper surface is composed of a patterned structure and completely has no C surface. This patterned structure has a series of regularly-arranged first protrusion portions $P_1$ in first size d1, in which, three adjacent first protrusion portions $P_1$-1, $P_1$-2 and $P_1$-4 form a triangle or a triangle-like shape, and the inside has a second protrusion portion $P_2$ in second size d2. Four adjacent first protrusion portions $P_1$-1, $P_1$-2, $P_1$-3 and $P_1$-4 form a rhombus, in which, between long diagonals are second protrusion portions and between short diagonals is a third protrusion portion $P_3$ in third size d3, where d3<d2<d1.

Referring to FIGS. 2 and 3, the projection of the first protrusion portion $P_1$ on the C surface of the sapphire substrate is a round or round-like shape, covering about 50%-90% of total area of the upper surface of the sapphire substrate. Diameter d1 is 0.5 μm-6 μm, and height h1 is 0.5 μm-2 μm, which are subject to actual design. This first protrusion portion $P_1$ is divided into a top part and a bottom part, wherein, the top part is a cone composed of multiple inclined surfaces, and the bottom part has a closed inclined surface. Angle between the top inclined surface and the c surface is 20-40°, and angle between the bottom inclined surface and c surface is 40-70°.

This second protrusion portion $P_2$ is composed of three or more inclined surfaces $S_1$-$S_3$, each being opposite to a first protrusion portion $P_1$. Angle between this inclined surface and c surface is 10-40°. In general, diameter d2 of the second protrusion portion $P_2$, which is 0.1 μm-3 μm, is less than or equals to diameter d1 of the first protrusion portion $P_1$. The height h2 is 0.1 μm-1.5 μm. Referring to FIGS. 1 and 3, a small recess $H_2$ is between two adjacent second protrusion portions $P_2$.

Referring to FIGS. 1 and 4, the highest point of the third protrusion portion $P_3$ between adjacent first protrusion portions $P_1$ is the lowest point of the small recess $H_2$.

In this embodiment, the upper surface of the patterned sapphire substrate is designed with a series of regularly-arranged first protrusion portions, wherein, the projection on the C surface appears round or polygon, and the top is a cone. Three adjacent first protrusion portions form a triangle and inside is designed with second protrusion portions. The second protrusion portion is a cone mainly composed of three or more inclined surfaces, each corresponding to one of the three first protrusion portions respectively so that the upper surface of sapphire is completely absent of c surface.

Figure 5:
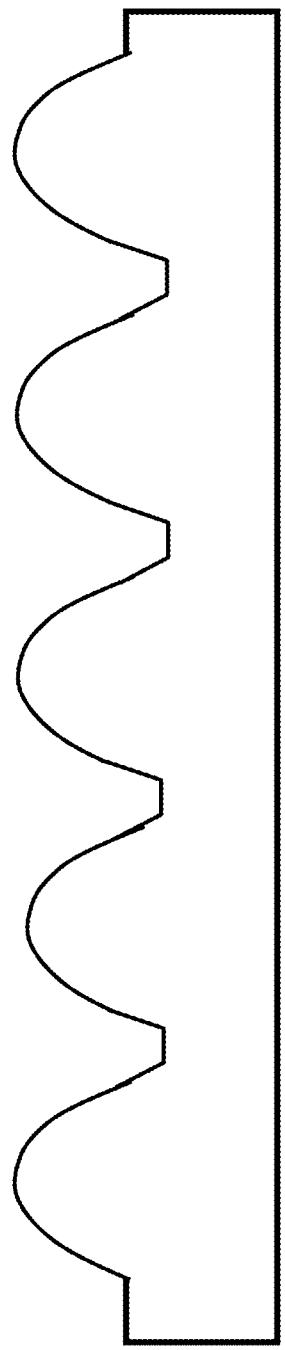
FIG. 5 shows a variant of the structure described in FIG. 4.

FIG. 5 displays a variant of the abovementioned embodiment. In this embodiment, between two adjacent first protrusion portions $P_1$, there is a V-shape notch positioned between two adjacent second protrusion portions $P_2$ at the same time. That means, it does not have the third protrusion portion $P_3$ described in FIG. 1. Two sides of the V-shape notch are composed of inclined surfaces of two second protrusion portions.

The method for manufacturing the abovementioned patterned sapphire substrate is briefly described with reference to FIGS. 6-8.

Figure 6:
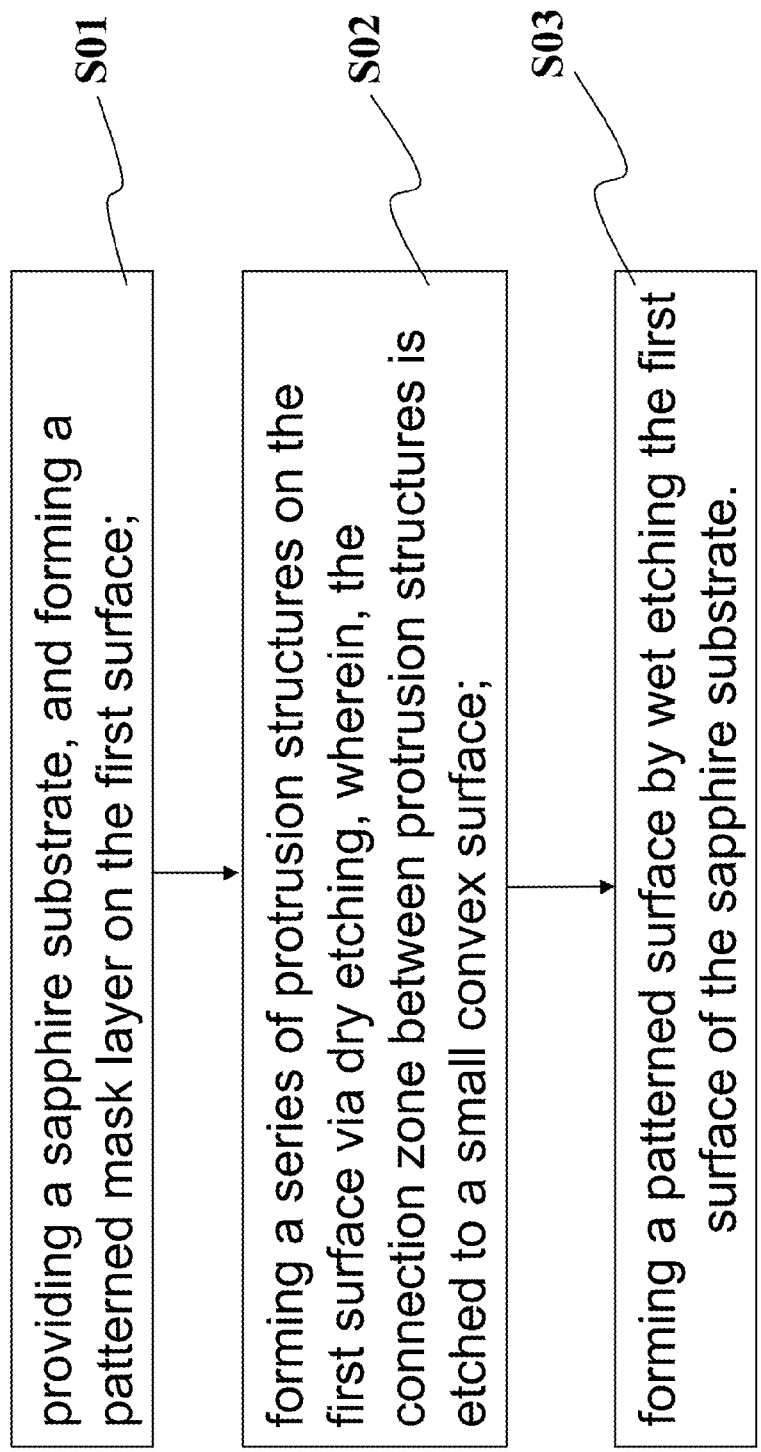
FIG. 6 is a schematic flow diagram for manufacturing a patterned sapphire substrate according to some embodiments.

Referring to FIG. 6, a method for manufacturing a patterned sapphire substrate comprises steps S01-S03, including formation of a light mask layer, dry etching of the substrate surface and wet etching of the substrate surface to form a patterned surface with no c surface.

Figure 7:
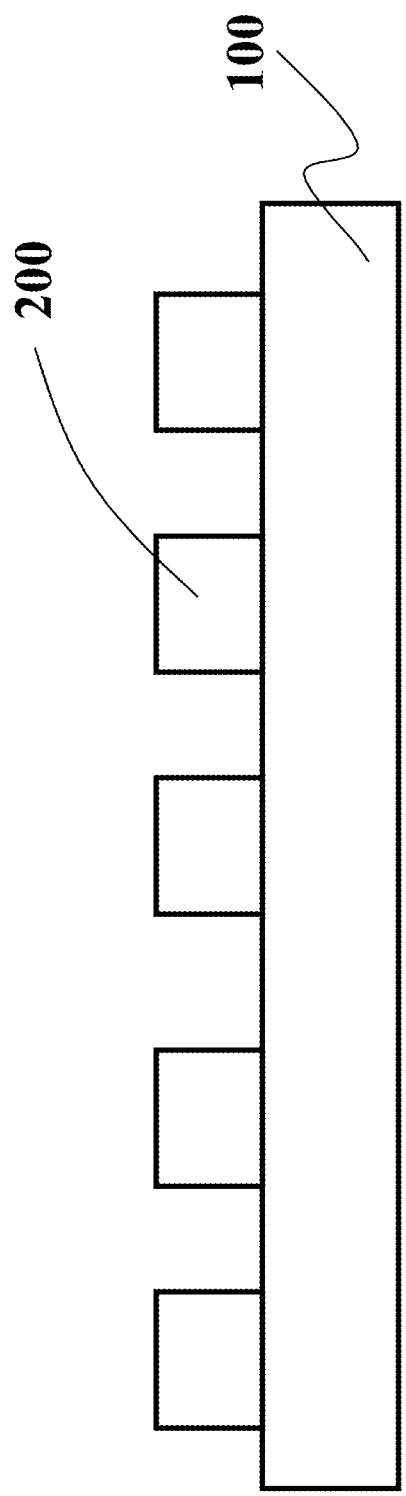
FIG. 7 illustrates a first step of a manufacturing process of a patterned sapphire substrate according to some embodiments.

S01: provide a sapphire substrate composed of a first surface and a second surface opposite to each other, and form a patterned mask layer 200 on the first surface, as shown in FIG. 7. Details are as follows: at first, coat a layer of light resistances on the smooth sapphire substrate, with thickness of 0.5 μm-3 μm; then, form a pattern through photolithography process. This method involves a step exposure machine, a contact exposure machine, a projection exposure machine or pressing method. The pattern diameter is 0.5 μm-6 μm, and gap between patterns is 0.5 μm-6 μm.

Figure 8:
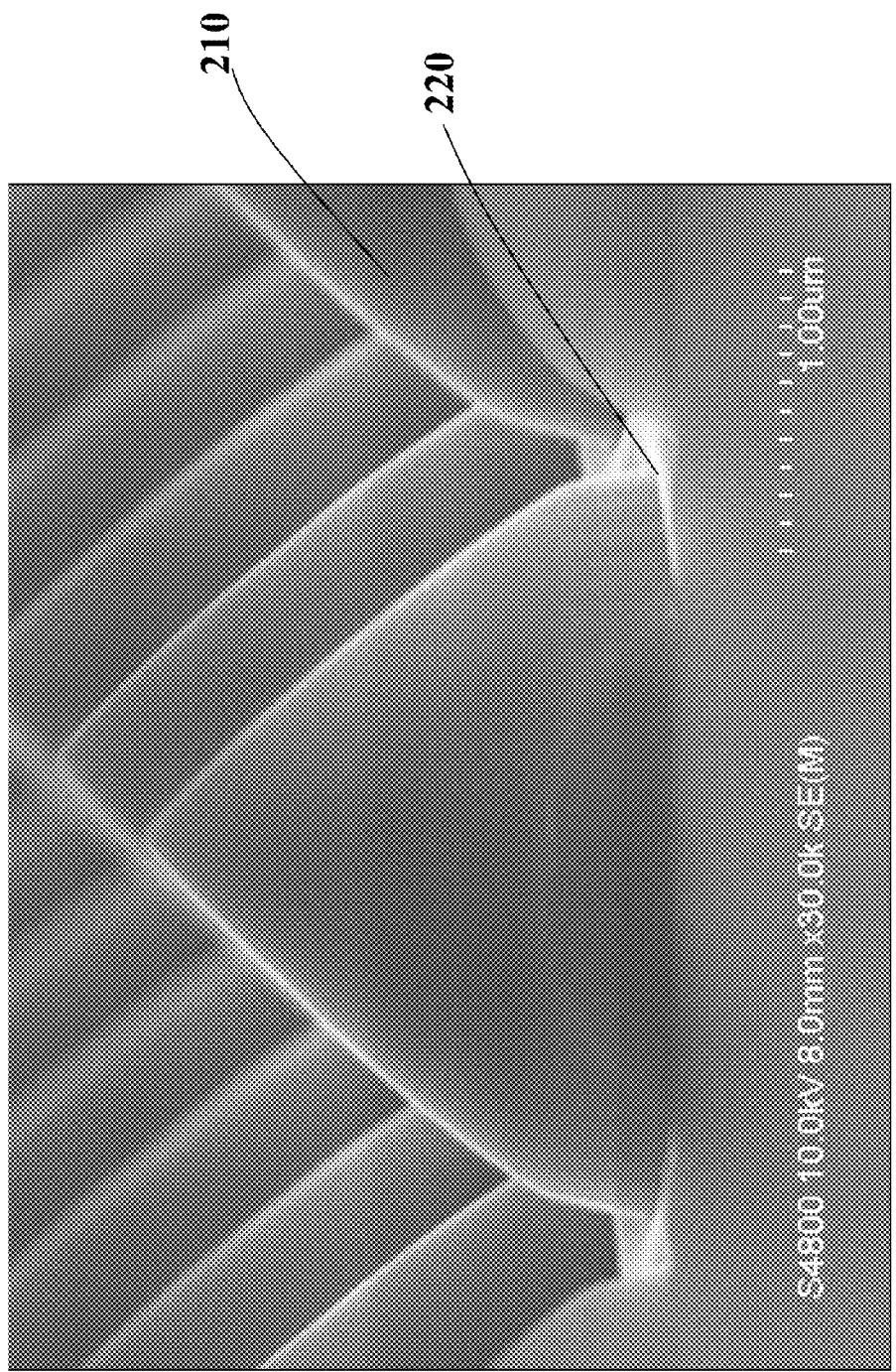
FIG. 8 illustrates a second step of a manufacturing process of a patterned sapphire substrate according to some embodiments.

S02: form a series of protrusion structures 210 on the first surface of the sapphire substrate via dry etching, wherein, the connection zone between protrusion structures is etched to a small convex surface 220, as shown in FIG. 8. Preferably, this small convex surface 220 is a curved surface with preferred height of 0.05 μm-0.5 μm. Details are as follows: convey the sapphire substrate with a light resistance pattern going through aforesaid processing to the ICP machine for etching, comprising programs below: upper electrode power, lower electrode power, chamber pressure and $BCl_3$ gas flow. The upper electrode power and the lower electrode power are 1.1-24:1. The chamber pressure is 0.1-1 Pa. The $BCl_3$ gas flow is 20~100% of the maximum gas flow of the machine.

S03: form a patterned surface through wet etching of the first surface of the sapphire substrate, as shown in FIG. 1. Details are as follows: place the sapphire substrate after ICP etching into high-temperature sulfur phosphoric acid mixture for etching, wherein, temperature is 150-300° C., and ratio between sulfur and phosphoric acid is 1:1-10:1.

Among the aforesaid steps, step 2) is an important step in this manufacturing method. It requires that the connection zone between protrusion structures 210 is etched to a small convex surface 220 so that no plane exists in the connection zone between protrusion structures 210. In this way, in step 3), a patterned structure shown in FIG. 1 can be obtained via wet etching.

Figure 9:
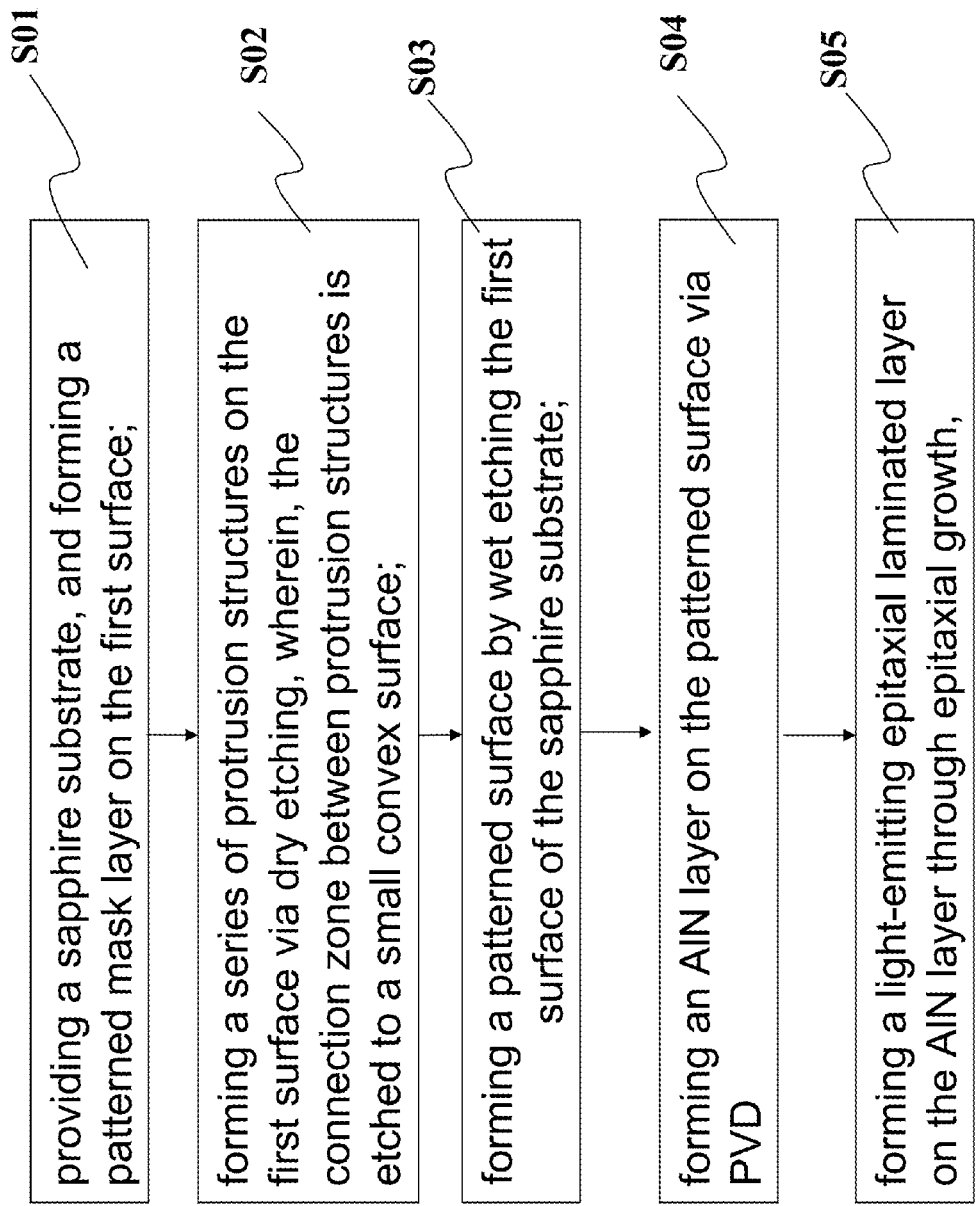
FIG. 9 is a schematic flow diagram for manufacturing a light emitting diode according to some embodiments.

FIG. 9 is a schematic flow diagram for manufacturing a light emitting diode according to the present invention, comprising steps S01-S05, wherein, in S01-S03, a patterned sapphire substrate is formed; in S04, an AlN layer is formed on the patterned sapphire substrate via PVD, and in S05, a light-emitting epitaxial laminated layer is formed on the AlN layer through epitaxial growth. Steps are described briefly below, in which, steps 01-03 can be referred to the aforesaid descriptions.

S04: form an AlN layer of 10-200 Å thick on the surface of the patterned sapphire substrate formed according to S01-S03.

S05: through epitaxial growth, grow a buffer layer 120, an n-type semiconductor layer 130, a light-emitting layer 140 and a p-type semiconductor layer 150 in sequence, wherein, the buffer layer 120 is III-based nitride material, preferably GaN, or AlN or AlGaN; the n-type semiconductor layer 130 is preferably GaN, or may be AlGaN with Si doping concentration of $1 \times 10^{19}$ cm$^{-3}$; the light emitting layer 140 preferably comprises at least one quantum well structure, which is preferred to be composed of 5-50 pairs of quantum wells with Mg doping concentration of $1 \times 10^{19}$-$5 \times 10^{21}$ cm$^{-3}$, and the preferred p-type semiconductor layer is a multi-layer structure composed of a p-type electronic blocking layer, a p-type conductive layer and a p-type contact layer, wherein, the p-type electronic blocking layer is closely adjacent to the light emitting layer 140 for preventing electrons from entering the p-type layer for electron-hole recombination. Preferably, material is AlGaN and thickness is 50-200 nm.

FIG. 10 shows a light emitting diode formed according to the method in FIG. 9, comprising: a patterned sapphire substrate 100, an AlN layer 110, a buffer layer 120, an n-type semiconductor layer 130, a light emitting layer 140 and a p-type semiconductor layer 150. In this light emitting diode, the growth surface of the patterned sapphire substrate completely has no C surface, which can effectively eliminate the threading dislocation formed on the C surface to improve lattice quality of the epitaxial structure; in addition, an AlN layer is firstly formed on the sapphire substrate via PVD as a seed layer, which is good for growth of the subsequent light-emitting epitaxial laminated layer; in addition, as no plane exists on the growth surface of the entire patterned sapphire substrate, light reflection and scattering regions are expanded so that more light is emitted from the light emitting diode, thereby greatly improving light extraction efficiency of LED.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A patterned sapphire substrate having a first and a second opposing surfaces, wherein:
   the first surface comprises a plurality of regularly-arranged first protrusion portions having a first size d1;
   a connection zone between the plurality of regularly-arranged first protrusion portions has no C surface;
   three adjacent first protrusion portions form a triangle, each having a second protrusion portion disposed therein with a second size d2;
   d1>d2; and
   the first protrusion portions and the second protrusion portions are connected directly or via curved surfaces such that the connection zone has no C surface.

2. The patterned sapphire substrate according to claim 1, wherein the first protrusion portions have no C surfaces.

3. The patterned sapphire substrate according to claim 1, wherein the second protrusion portions have no C surfaces.

4. The patterned sapphire substrate according to claim 1, wherein the first surface has no C surface.

5. The patterned sapphire substrate according to claim 1, wherein:
   four adjacent first protrusion portions form a rhombus; and
   between long diagonals of the rhombus are two second protrusion portions.

6. The patterned sapphire substrate according to claim 5, wherein between short diagonals of the rhombus is a third protrusion portion with a third size d3, where d3<d2.

7. The patterned sapphire substrate according to claim 6, wherein a recess portion is between two second protrusion portions, a lowest portion of the recess portion is a highest point of the third protrusion portion.

8. The patterned sapphire substrate according to claim 1, wherein the second protrusion portion comprises a cone including three or more inclined surfaces, each corresponding to one of the three first protrusion portions, respectively.

9. The patterned sapphire substrate according to claim 8, wherein an angle between the inclined surface of the second protrusion portion and the C surface of the sapphire substrate is 10°-40°.

10. The patterned sapphire substrate according to claim 8, wherein:
    between two nearest first protrusion portions, there is a V-shape notch positioned between two adjacent second protrusion portions;
    two sides of the V-shape notch are formed by the inclined surfaces of two second protrusion portions.

11. The patterned sapphire substrate according to claim 1, wherein a ratio of height h1 of the first protrusion portion and height h2 of the second protrusion portion is 2-50.

12. The patterned sapphire substrate according to claim 1, wherein the first protrusion portion covers 50%-90% of a total area of the first surface.

13. The patterned sapphire substrate according to claim 1, wherein: a top portion of the first protrusion portion is a cone and has a projection on the C surface as round or polygon.

14. A light emitting diode comprising:
    a patterned sapphire substrate having a first and a second opposing surfaces; and
    a light-emitting epitaxial laminated layer formed on the patterned sapphire substrate, wherein:
    the first surface comprises a plurality of regularly-arranged first protrusion portions having a first size d1;
    a connection zone between the plurality of regularly-arranged first protrusion portions has no C surface;
    over the patterned sapphire substrate is an AlN layer formed via physical vapor deposition (PVD), and
    the light-emitting epitaxial laminated layer is formed on the AlN layer.

15. A method of manufacturing a patterned sapphire substrate, comprising:
    1) providing a sapphire substrate having of a first and a second opposing surfaces, and forming a patterned mask layer over the first surface;
    2) forming a plurality of protrusion structures on the first surface via dry etching, wherein a connection zone between protrusion structures is etched to a small convex surface;
    3) wet etching the first surface of the sapphire substrate to form a patterned surface having a plurality of regularly-arranged first protrusion portions with a first size d1, wherein the connection zone between first protrusion portions has no C surface;
    wherein the manufactured patterned sapphire substrate has the first and second opposing surfaces, wherein:
    the first surface comprises the plurality of regularly-arranged first protrusion portions having the first size d1;
    the connection zone between the plurality of regularly-arranged first protrusion portions has no C surface;
    the small convex surface connecting protrusion structures formed in step 2) has a height of 0.05 µm-0.5 µm;
    in step 3), the patterned surface is formed by etching the first surface of the sapphire substrate with sulfur phosphoric acid mixture; and
    the patterned surface formed in step 3 has a plurality of second protrusion portions in second size d2; three adjacent first protrusion portions form a triangle, each having a second protrusion portion inside, where d1>d2; and the first protrusion portion and the second protrusion portion are connected directly or via a curved surface so that the connection zone has no C surface.

16. The method of claim 15, wherein the patterned mask layer in step 1) comprises a plurality of column light resistances, oxides, or metals.

17. The method of claim 15, wherein the small convex surface connecting protrusion structures formed in step 2) is a curved surface.

* * * * *